(12) United States Patent
Shingaki et al.

(10) Patent No.: US 7,099,645 B2
(45) Date of Patent: Aug. 29, 2006

(54) MULTILAYER LC FILTER

(75) Inventors: Tadashi Shingaki, Ise (JP); Junichi Ichikawa, Ise (JP)

(73) Assignee: NGK Spark Plug Co., Ltd., Aichi (JP)

( * ) Notice: Subject to any disclaimer, the term of this patent is extended or adjusted under 35 U.S.C. 154(b) by 369 days.

(21) Appl. No.: 10/325,942

(22) Filed: Dec. 23, 2002

(65) Prior Publication Data

US 2003/0129957 A1    Jul. 10, 2003

(30) Foreign Application Priority Data

Dec. 25, 2001    (JP)    ............... 2001-391950

(51) Int. Cl.
*H01P 1/20*    (2006.01)
(52) U.S. Cl. .................. 455/307; 333/219; 333/204; 333/339
(58) Field of Classification Search ............... 333/175, 333/184, 204, 185, 133, 219, 339; 455/307, 455/339, 550.1
See application file for complete search history.

(56) References Cited

U.S. PATENT DOCUMENTS

| | | | | |
|---|---|---|---|---|
| 5,051,712 | A * | 9/1991 | Naito et al. ............... | 333/185 |
| 5,173,670 | A * | 12/1992 | Naito et al. ............... | 333/184 |
| 5,248,949 | A * | 9/1993 | Eguchi et al. ............. | 333/204 |
| 5,719,539 | A * | 2/1998 | Ishizaki et al. ............ | 333/204 |
| 6,025,761 | A * | 2/2000 | Watanabe et al. .......... | 333/133 |
| 6,249,194 | B1 * | 6/2001 | Watanabe et al. .......... | 333/133 |
| 6,504,452 | B1 * | 1/2003 | Takada et al. ............. | 333/185 |
| 6,791,435 | B1 * | 9/2004 | Shingaki et al. ........... | 333/175 |
| 6,831,530 | B1 * | 12/2004 | Ichikawa et al. .......... | 333/184 |

FOREIGN PATENT DOCUMENTS

| | | |
|---|---|---|
| JP | 4-150011 | 5/1992 |
| JP | 8-242136 | 9/1995 |
| JP | 8097603 | 4/1996 |
| JP | 9219340 | 8/1997 |
| JP | 10-70402 | 3/1998 |
| JP | 10106838 | 4/1998 |
| JP | 10-209710 | 8/1998 |
| JP | 11-261362 | 9/1999 |
| JP | 11283833 | 10/1999 |
| JP | 2000-20901 | 7/2000 |
| JP | 2000-341087 | 12/2000 |
| WO | WO 97/36306 | 10/1997 |

* cited by examiner

*Primary Examiner*—Quochien B. Vuong
*Assistant Examiner*—Christian A. Hannon
(74) *Attorney, Agent, or Firm*—Stites & Harbison PLLC; Ross F. Hunt, Jr.

(57) ABSTRACT

A multilayer LC filter includes a terminal layer, and a plurality of capacitor electrode layers laminated together on the terminal layer. An inductor layer is disposed above the capacitor electrode layers to thereby form a laminated body. First and second strip-shaped side-surface electrodes are formed on opposite side surfaces of the laminated body, and are connected to input and output terminals of the terminal layer, respectively. The distal ends of the first and second strip-shaped side-surface electrodes extend to the corresponding side surfaces of the capacitor electrode layers, but do not reach the side surfaces of the inductor layer. Thus, the distances between the resonator inductors of the inductor layer and the strip-shaped side-surface electrodes are increased, and as a result, very little stray capacitance is generated between the resonator inductors and the side-surface electrodes.

4 Claims, 10 Drawing Sheets

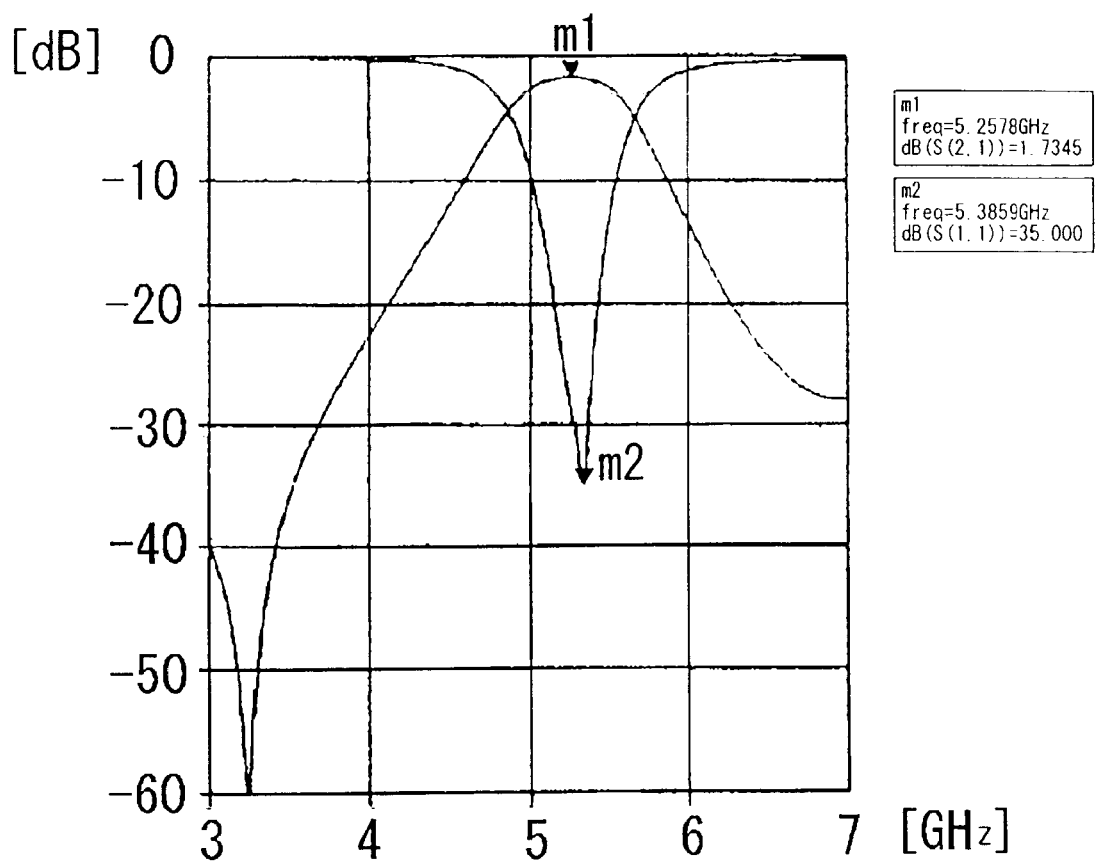

MULTILAYER LC FILTER

BACKGROUND OF THE INVENTION

1. Field of the Invention

The present invention relates to a multilayer LC filter to be used in mobile communication devices such as cellular phones.

2. Description of the Related Art

Miniaturized, low-loss multilayer LC filters which are suitable for mass production are conventionally used in mobile communication devices such as cellular phones. Such a multilayer LC filter is typically configured in such a manner that a plurality of electrodes are laminated with dielectric layers interposed therebetween. FIG. 6 shows a multilayer LC filter A of such a stacked or laminated configuration. The multilayer LC filter A of FIG. 6 includes a terminal layer c; a ground electrode layer d; an inductor layer e; capacitor layers f, g, h, i, and j; and a ground electrode layer k. These layers are laminated in this order from the bottom side, to thereby form a laminated body a containing a plurality of electrodes. Terminals m, such as an input terminal, an output terminal, and a ground terminal, are formed on the terminal layer c in an exposed condition so that electrical connections can be made thereto.

Further, as shown in FIG. 7, which depicts the assembled filter A, stripe-shaped side-surface or laterally disposed electrodes b are formed on the side surfaces of the laminated body a in such a manner that each of the side-surface electrodes b is connected to a corresponding terminal m. The stripe-shaped side-surface electrodes b extend to the top face of the laminated body a along the direction of lamination, in order to enable reliable mounting of the multilayer LC filter A onto a given mounting surface.

The above-described conventional multilayer LC filter of FIGS. 6 and 7 has frequency characteristics such that no proper or substantial attenuation peak appears on the higher-frequency side of the pass band, although a large attenuation peak appears on the lower-frequency side thereof. Therefore, there is a problem with providing sufficient attenuation on the higher-frequency side. Since the presence or absence of an attenuation peak on the higher-frequency side greatly affects the performance of the filter, a strong demand has arisen for an effective measure that would solve the problem of providing such an attenuation peak.

Conceivably, the above-mentioned problem of insufficient attenuation on the higher-frequency side occurs because the electrodes contained in the laminated body are close to the stripe=shaped side-surface electrodes formed on the outer surface of the laminated body, thereby resulting in the generation of distributed stray capacitance between these electrodes. In particular, stray capacitance is likely to be generated between the side-surface electrodes and each of the ground and inductor electrodes formed in a large area extending to the vicinity of the periphery of the laminated body. In order to solve the above problem, a construction may be employed wherein the distances between the electrodes contained in the laminated body and the side-surface electrodes are increased to a large as possible extent. For example, the dimensions of the laminated body can be maintained unchanged, while the electrodes contained in the laminated body are formed at a central portion of the laminated body such that the pattern area of each electrode is reduced. Alternatively, the pattern area of each electrode can be maintained unchanged, while the dimensions of the laminated body are increased. However, the former measure results in deterioration in the filter characteristics, and the latter measure results in an increase in the physical size of the multilayer LC filter.

SUMMARY OF THE INVENTION

In view of the foregoing, an object of the present invention is to provide a multilayer LC filter which can provides the desired filter characteristics without an increase in the size thereof and which, in particular, provides an attenuation peak on the higher-frequency side of its pass band.

In accordance with the present invention, there is provided a multilayer LC filter which is formed of a laminated body including a plurality of laminated dielectric layers and which includes first and second resonator inductors formed on a common dielectric layer; a first LC resonance circuit containing the first resonator inductor; and a second LC resonance circuit containing the second resonator inductor. The multilayer LC filter comprises input and output terminals formed on a surface of the laminated body; a laminated capacitor section including a plurality of capacitor electrodes and a plurality of dielectric layers alternately laminated between said capacitor electrodes; a first ground electrode formed between the laminated capacitor section and the inductors; and first and second stripe-shaped side-surface electrodes connected to the input terminal and the output terminal, respectively, the first and second stripe-shaped side-surface electrodes each being formed on a side surface of the laminated body, wherein the stripe-shaped side-surface electrodes are not formed at locations which correspond to those of the first ground electrode and the inductors with respect to the direction of lamination of the dielectric layers. Stated differently, the stripe-shaped side-surface electrodes each extend only a limited distance along the respective side surface in the direction of lamination of the dielectric layers and terminate at a location which is spaced from those of the first ground electrode and the inductors.

By virtue of the above-described configuration, wherein the stripe-shaped side-surface electrodes connected to the input and output terminals, respectively, are formed so as not to reach or expand to the locations which correspond to those of the first ground electrode and the inductors with respect to the direction of lamination of the dielectric layers, the distance between the ground electrode of the ground electrode layer and each of the stripe-shaped side-surface electrodes is increased as are the distances between the resonator inductors and the stripe-shaped side-surface electrodes. Therefore, minimal stray capacitance is generated between the side-surface electrodes, on the one hand, and the ground electrode and the resonator inductors, on the other hand.

According to a further aspect of the present invention, there is provided a multilayer LC fitter which is formed of a laminated body including a plurality of laminated dielectric layers and which includes a first LC resonance circuit containing a first resonator inductor; and a second LC resonance circuit containing a second resonator inductor. The multilayer LC filter comprises input and output terminals formed on a surface of the laminated body; a capacitor laminated section including a plurality of capacitor electrodes and a plurality of dielectric layers laminated alternately; the first and second resonator inductors formed on a common dielectric layer above the capacitor laminated section; a first ground electrode formed between the capacitor laminated section and the first and second resonator inductors; and first and second stripe-shaped side-surface electrodes connected to the input terminal and the output terminal, respectively, the first and stripe-shaped side-surface electrodes each being formed on a side surface of the laminated body, the stripe-shaped side-surface electrodes having distal ends which do not reach, i.e., do not extend to, a location corresponding to that of the first ground electrode with respect to the direction of lamination of the dielectric layers.

By virtue of the above-described configuration, wherein the stripe-shaped side-surface electrodes connected to the input and output terminals, respectively, are formed so as to reach the side surfaces of the capacitor laminated section but not to reach the location corresponding to that of the first ground electrode with respect to the direction of lamination of the dielectric layers, the distance between the ground electrode and each of the stripe-shaped side-surface electrodes is increased as is the distances between the resonator inductors of the inductor layer and the stripe-shaped side-surface electrodes. Therefore, minimal capacitance is generated between side-surface electrodes and the ground electrode or the resonator inductors.

In the multilayer LC filter according to the present invention, each of the capacitor electrodes formed on the capacitor layers is smaller in area than the resonator inductors of the inductor layer, and is formed at a central portion of a corresponding dielectric layer. Therefore, sufficiently large separation distances are obtained between the capacitor electrodes and the stripe-shaped side-surface electrodes, and minimal stray capacitance is generated between the capacitor electrodes and the side-surface electrodes. Accordingly, even when the distal ends of the side-surface electrodes are located on the side surfaces of the capacitor laminated section, the above-discussed problem of insufficient attenuation on the higher-frequency side of the pass band of the LC filter does not occur.

Preferably, the first LC resonance circuit includes a first resonator capacitor, and the second LC resonance circuit includes a second resonator capacitor; the first ground electrode is formed on a dielectric layer disposed below the first and second resonator inductors; a second ground electrode is formed on a dielectric layer disposed above the first and second resonator inductors; the laminated body carries the first resonator capacitor, the second resonator capacitor, and a frequency adjustment capacitor, which are constituted by the plurality of dielectric layers, the capacitor electrodes of the capacitor laminated section, and the first ground electrode.

The above-described configuration enables the multilayer LC filter to attain desired frequency characteristics such that a desired attenuation peak appears on the higher-frequency side of the pass band.

According to another aspect of the present invention, there is provided a multilayer LC filter in which the capacitor laminated section includes first, second, and third capacitor electrode layers laminated in this sequence from the bottom, the first capacitor electrode layer including a center electrode formed on a dielectric layer, the second capacitor electrode layer including first and second input-output electrodes formed on a dielectric layer, the third capacitor electrode layer including first and second common electrodes formed on a dielectric layer The multilayer LC filter comprises a peak generation capacitor constituted by the center electrode, the first input-output electrode, and the second input-output electrode; a first input-output coupling capacitor constituted by the first input-output electrode and the first common electrode; a second input-output coupling capacitor constituted by the second input-output electrode and the second common electrode; an inter-stage coupling capacitor constituted by the first and second common electrodes; a first resonator capacitor constituted by the first common electrode and the first ground electrode; and a second resonator capacitor constituted by the second common electrode and the first ground electrode, the peak generation capacitor, the first input-output coupling capacitor, the second input-output coupling capacitor, and the inter-stage coupling capacitor each serving as a frequency adjustment capacitor.

The above-described configuration enables the multilayer LC filter to attain desired frequency characteristics such that a desired attenuation peak appears on both the lower-frequency side and the higher-frequency side of the pass band of the LC filter.

Further features and advantages of the present invention will be set forth in, or apparent from, the detailed description of preferred embodiments thereof which follows.

BRIEF DESCRIPTION OF THE DRAWINGS

FIG. 5A is a graph showing frequency characteristics of a multilayer LC filter in which the distal ends of the stripe-shaped side-surface electrodes are formed so as to extend to the side surface of the first ground electrode layer;

DESCRIPTION OF THE PREFERRED EMBODIMENTS

Figure 1:
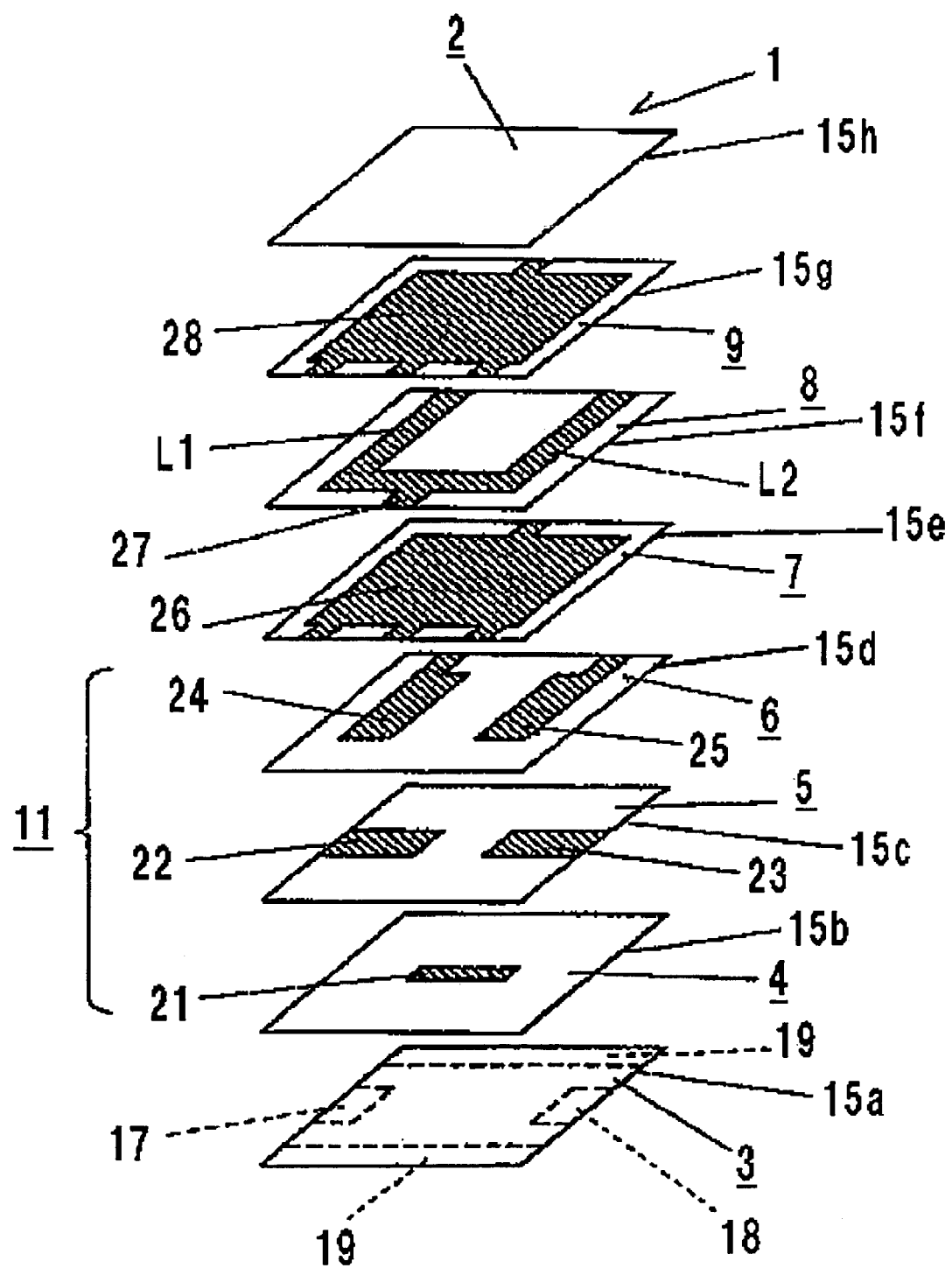
FIG. 1 is an exploded perspective view of a multilayer LC filter according to the present invention.

A multilayer LC filter 1 according to one embodiment of the present invention will next be described with reference to the accompanying drawings. As shown in FIG. 1, the multilayer LC filter 1 includes a terminal layer 3, a first capacitor electrode layer 4, a second capacitor electrode layer 5, a third capacitor electrode layer 6, a first ground electrode layer 7, an inductor layer 8, and a second ground electrode layer 9.

The terminal layer 3 includes a dielectric layer 15a; and an input terminal 17, an output terminal 18, and ground terminals 19 formed on the lower surface of the dielectric layer 15a.

The first capacitor electrode layer 4 includes a dielectric layer 15b; and a central electrode 21 formed on the upper surface of the dielectric layer 15b.

The second capacitor electrode layer 5 includes a dielectric layer 15c; and first and second input-output electrodes 22 and 23 formed on the upper surface of the dielectric layer 15c.

The third capacitor electrode layer 6 includes a dielectric layer 15d; and first and second common electrodes 24 and 25 formed on the upper surface of the dielectric layer 15d.

The inductor layer 8 includes a dielectric layer 15f; and a first resonator inductor L1 and a second resonator inductor L2 formed on the upper surface of the dielectric layer 15f.

The first ground electrode layer 7, which serves as a ground layer, includes a dielectric layer 15e; and a first ground electrode 26 formed on the upper surface of the dielectric layer 15e.

The second ground electrode layer 9 includes a dielectric layer 15g; and a second ground electrode 28 formed on the upper surface of the dielectric layer 15g.

Figure 2:
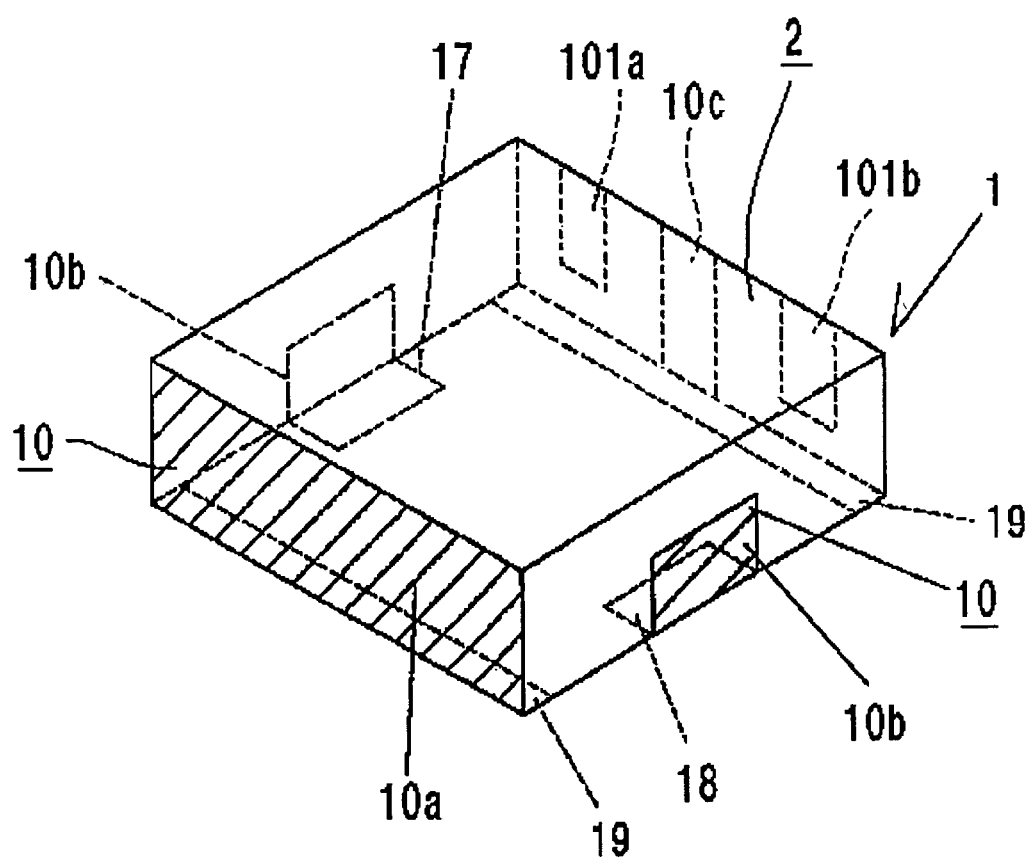
FIG. 2 is an external perspective view of the multilayer LC filter according to the present invention.

The multilayer LC filter 1 of the present invention includes two LC resonance circuits 12 and 13 (see FIG. 3) incorporated in two different stages, and has a multilayer structure as shown in FIG. 1, in which a plurality of electrodes are laminated together with the dielectric layers 15 interposed therebetween. Further, as shown in FIG. 2, side-surface electrodes 10 are disposed on the side surfaces of the laminated body 2, which has a generally rectangular cross section.

The laminated body 2 will be described in more detail with reference to FIG. 1. The terminal layer 3 is formed at the bottom of the laminated body 2. The plurality of capacitor electrode layers 4, 5, and 6 are laminated together on the terminal layer 3 in order to form a capacitor laminated section 11. Further, the first ground electrode layer 7, the inductor layer 8, the first ground electrode layer 9, and a dielectric layer 15h having no electrode are successively formed on the capacitor laminated section 11.

In the terminal layer 3, the input terminal 17 and the output terminal 18 are formed on the dielectric layer 15a so as to be located at respective central portions of opposite side edges thereof. The ground electrodes 19 are formed on the dielectric layer 15a so as to extend along the respective entire lengths of the remaining opposite side edges, i.e., the edges along which the input terminal 17 and the output terminal 18 are not formed. The ground terminals 19 are to be grounded.

In the first capacitor electrode layer 4, the central electrode 21, which as strip-like shape, is formed at the central portion of the dielectric layer 15b. In the second capacitor electrode layer 5, the first and second input-output electrodes 22 and 23, each having a rectangular shape, are formed in such a manner that the electrodes 22 and 23 extend to the center from opposite side edges of the dielectric layer 15c. In the third capacitor electrode layer 6, the first and second common electrodes 24 and 25, each having a generally rectangular shape, are formed so as to be connected with the inductors L1 and L2 of the inductor layer 8, respectively.

In the first ground electrode layer 7, which is provided above the capacitor laminated section 11, the first ground electrode 26, which to be grounded, is formed on the dielectric layer 15e so as to cover a large area thereof.

In the inductor layer 8, which is provided above the first ground electrode layer 7, the first resonator inductor L1 and the second resonator inductor L2 of the first resonance circuit 12 and the second resonance circuit 13 are formed on the dielectric layer 15f. The first resonator inductor L1 and the second resonator inductor L2 are constituted by two stripe-shaped electrodes which are formed in parallel in order to produce a magnetic field coupling between the electrodes. The first resonator inductor L1 is connected to the first common electrode 24 of the third capacitor electrode layer 6. The second resonator inductor L2 is connected to the second common electrode 25 of the third capacitor electrode layer 6. Further, the first and second resonator inductors L1 and L2 are connected to one of the ground terminals 19 of the terminal layer 3 via a lead electrode 27 which is continuous with the first and second resonator inductors L1 and L2.

As described above, the second ground electrode layer 9 is provided above the inductor layer 8 and carries the second ground electrode 28. Thus, the inductor layer 8 is sandwiched between the first ground electrode layer 7 and the second ground electrode layer 9. This configuration improves the shielding performance of the multilayer LC filter 1, i.e., the shielding of the magnetic field coupling generated in the inductor layer 8, to thereby improve the filter characteristics of the multilayer LC filter 1.

Further, as described above, the dielectric layer 15h having no electrode is formed on the second ground electrode layer 9.

The laminated body 2 having the above-described configuration can be fabricated through a process in which an electrode or electrodes of a predetermined pattern are formed on each of a plurality of dielectric sheets by means of screen printing (which is, of course, a well known technique) and the plurality of dielectric sheets are thereafter laminated and fired.

The dielectric sheets are preferably formed of a dielectric material obtained through kneading of a powder of a dielectric material and/or a powder of a magnetic material, together with a binder and other necessary additives. The electrodes are preferably formed from paste of a conductive material such as Ag, Pd, Cu, Ni, Au, or Ag—Pd.

Figure 3:
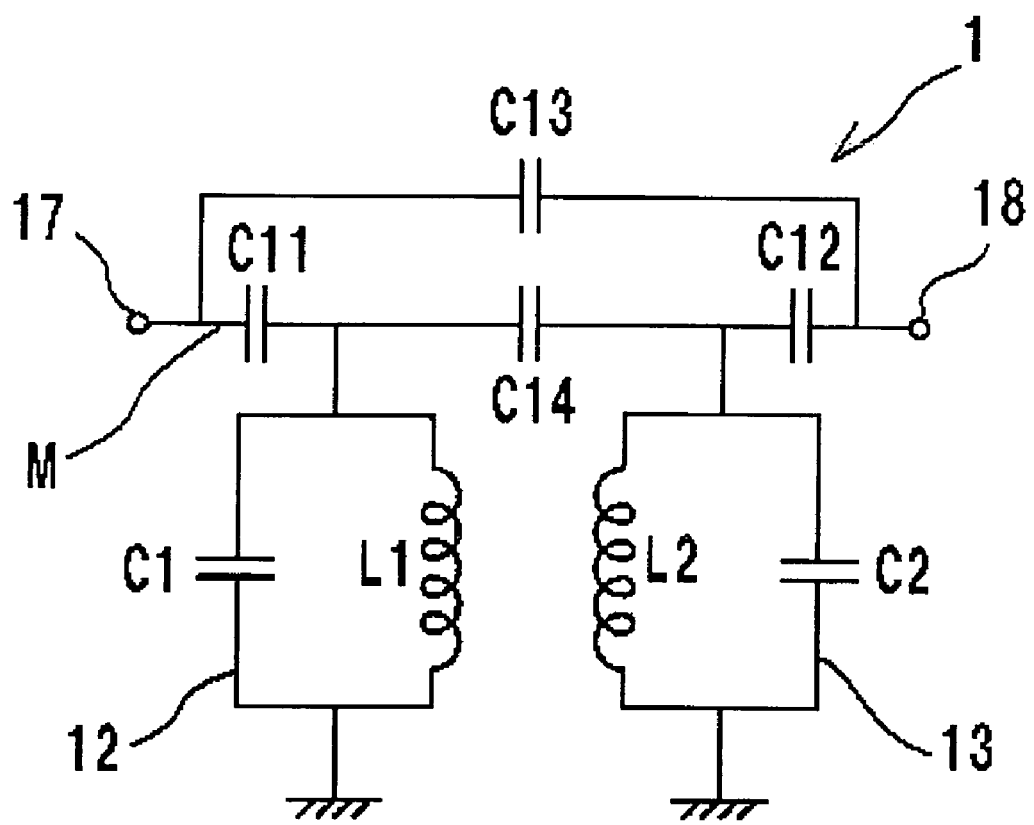
FIG. 3 is a circuit diagram of an equivalent circuit of the multilayer LC filter according to the present invention.

FIG. 3 shows the equivalent circuit of the multilayer LC filter 1. As shown in FIG. 3, the multilayer LC filter 1 of the present invention includes an input/output line M for connecting the input terminal 17 and the output terminal 18. The input/output line M, to which high-frequency voltage is applied, includes a first input-output-coupling capacitor C11, a second input-output-coupling capacitor C12, and an inter-stage coupling capacitor 14 serially disposed between the input-output-coupling capacitors C11 and C12.

The first input-output-coupling capacitor C11 is constituted by the first input-output electrode 22 of the second capacitor electrode layer 5 and the first common electrode 24 of the third capacitor electrode layer 6. The second input-output-coupling capacitor C12 is constituted by the second input-output electrode 23 of the second capacitor electrode layer 5 and the second common electrode 25 of the third capacitor electrode layer 6.

The inter-stage coupling capacitor C14 is formed, in a distributed state, between the first common electrodes 24 and the second common electrodes 25 of the third capacitor electrode layer 6.

Further, one end of the first LC resonance circuit 12 is connected to the node between the first input-output coupling capacitor C11 and the inter-stage coupling capacitor C14, whereas one end of the second LC resonance circuit 13 is connected to the node between the inter-stage coupling capacitor C14 and the second input-output coupling capacitor C12. The other end of the first LC resonance circuit 12 and the other end of the second LC resonance circuit 13 are both grounded.

The first LC resonance circuit 12 includes a first resonator capacitor C1 and the first resonator inductor L1 connected in parallel. The second LC resonance circuit 13 includes a second resonator capacitor C2 and the second resonator inductor L2 connected in parallel.

As described above, the first and second resonator inductors L1 and L2 are provided on the inductor layer 8 and establish magnetic field coupling therebetween. Further, the first resonator capacitor C1 is constituted by the first common electrode 24 of the third capacitor electrode layer 6 and the first ground electrode 26 of the first ground electrode layer 7, whereas the second resonator capacitor C2 is constituted by the second common electrode 25 of the third capacitor electrode layer 6 and the first ground electrode 26 of the first ground electrode layer 7.

In brief, the first resonator capacitor C1, the second resonator capacitor C2, the first input-output coupling capacitor C11, the second input-output coupling capacitor C12, a peak generation capacitor C13, and the inter-stage coupling capacitor C14 are connected and held together through lamination of the terminal layer 3, the capacitor electrode layers 4, 5, and 6 of the capacitor laminated section 11, and the first ground electrode layer 7.

The peak generation capacitor C13 is connected between the input terminal 17 and the output terminal 18 in parallel with the serially connected capacitors C11, C14, and C12. The peak generation capacitor C13 is constituted by the center electrode 21 of the capacitor layer 4, and the first and second input-output electrodes 22 and 23 of the capacitor layer 5.

It is noted that the resonator capacitors C1 and C2 are provided so as to constitute the capacitive portions of the LC resonance circuits 12 and 13, respectively, while the input-output coupling capacitors C11 and C12, the peak generation capacitor C13, and the inter-stage coupling capacitor C14 are provided as frequency adjustment capacitors.

Next, the side-surface electrodes 10, which are an important feature of the present invention, will be described in detail. As shown in FIG. 2, the side-surface electrodes 10 are connected to the input terminal 17, the output terminal 18, and the ground terminals 19 formed on the terminal layer 3 and extend along the corresponding side surfaces in the direction of lamination.

Of these side-surface electrodes 10, the ground side-surface electrodes 10a and 10c, which are connected to the ground terminals 19 and are disposed on the corresponding opposite side surfaces, extend in the lamination direction up to the top surface of the laminated body 2.

A connection side-surface electrode 101a is connected between the resonator inductor L1 and the first common electrode 24. Similarly, a connection side-surface electrode 101b is connected between the resonator inductor L2 and the second common electrode 25.

In addition, stripe-shaped side-surface electrodes 10b, which are connected to the input terminal 17 and the output terminal 18, respectively, and are disposed on the corresponding opposite side surfaces, extend in the lamination direction to an extent such that the distal ends of the side-surface electrodes 10b reach the corresponding side surfaces of the capacitor laminated section 11 but do not extend to the top surface of the laminated body 2. In other words, the stripe-shaped side-surface electrodes 10b are not formed at a vertical position corresponding to that of the first ground electrode (i.e., at a location which corresponds to that of the first ground electrode with respect to the direction of lamination of the dielectric layers). Thus, in brief summary, the multilayer LC filter 1 of the present invention is of a construction wherein the stripe-shaped side-surface electrodes 10b are not formed at, i.e., do not extend to, vertical positions corresponding to that of the first ground electrode 7, the inductor layer 8, and the second ground electrode 9.

Since the electrodes 26, 27, L1, L2, and 28 formed on the first ground electrode layer 7, the inductor layer 8, and the second ground electrode layer 9 extend to the vicinity of the side surfaces of the laminated body 2, if the stripe-shaped side-surface electrodes 10b were formed to cover the side surfaces of these layers 7, 8, and 9, stray capacitance would be generated between the stripe-shaped side-surface electrodes 10b and the electrodes 26, 27, L1, L2, and 28 of the layers 7, 8, and 9. More specifically, if the stripe-shaped side-surface electrodes 10b are formed at a vertical position corresponding to that of the first ground electrode, the inductors, or the second ground electrode (i.e., at a location which corresponds to that of the first ground electrode, the inductors, or the second ground electrode with respect to the direction of lamination of the dielectric layers), stray capacitance is generated between the stripe-shaped side-surface electrodes 10b and the electrode 26, the electrodes 27, L1, L2, or the electrode 28. In contrast, in the multilayer LC filter 1 of the present invention, since the distances between the stripe-shaped side-surface electrodes 10b and the resonator inductors L1 and L2 and the distances between the stripe-shaped side-surface electrodes 10b and the ground electrodes 26 and 28 are substantial, very little stray capacitance is generated between the side-surface electrodes 10b and the inductors L1 and L2 or ground electrodes 26 and 28. Therefore, the multilayer LC filter 1 can attain improved filter characteristics.

Figure 4A:
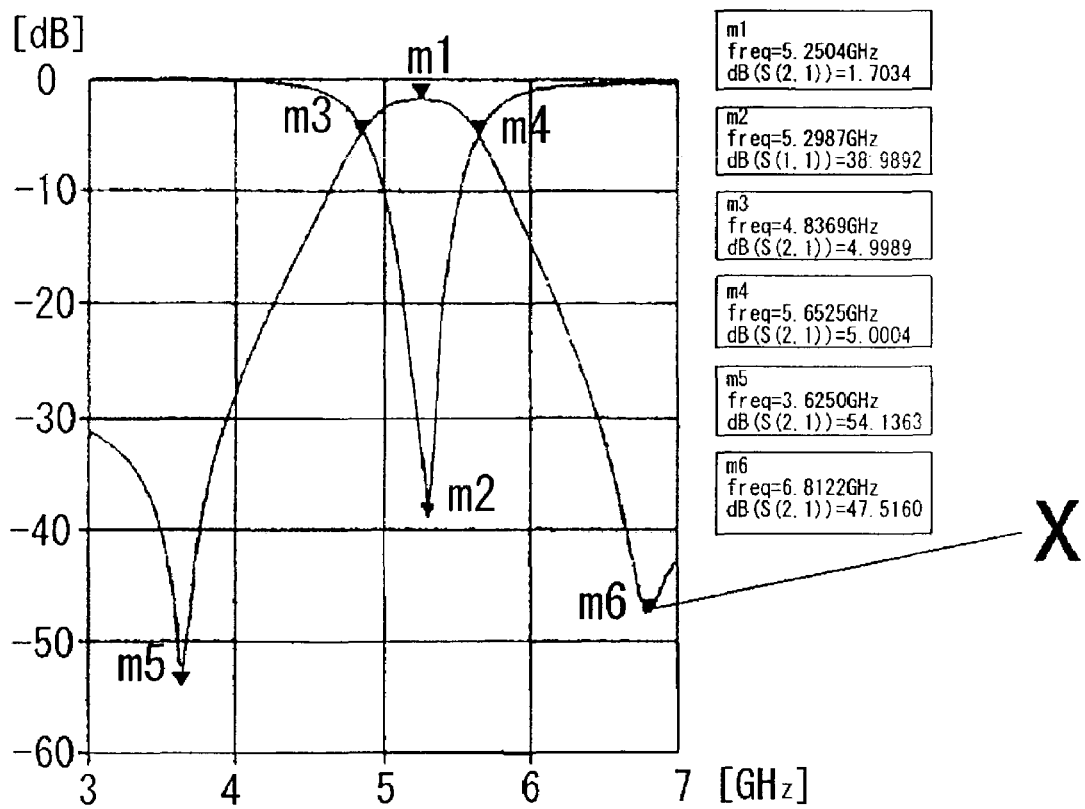
FIG. 4A is a graph showing frequency characteristics of a multilayer LC filter in which the distal ends of the stripe-shaped side-surface electrodes are formed so as to extend to the side surface of the third capacitor electrode layer.

FIG. 4A shows the frequency characteristics of the multilayer LC filter in which the stripe-shaped side-surface electrodes 10b extending from the input terminal 17 and the output terminal 18 are formed in such a manner that the distal ends of the side-surface electrodes 10b are located on the corresponding side surfaces of the third capacitor electrode layer 6, which generates the inter-stage coupling capacitor 014. In this case, as illustrated, an attenuation peak x appears on the higher-frequency side of the pass band.

Figure 4B:
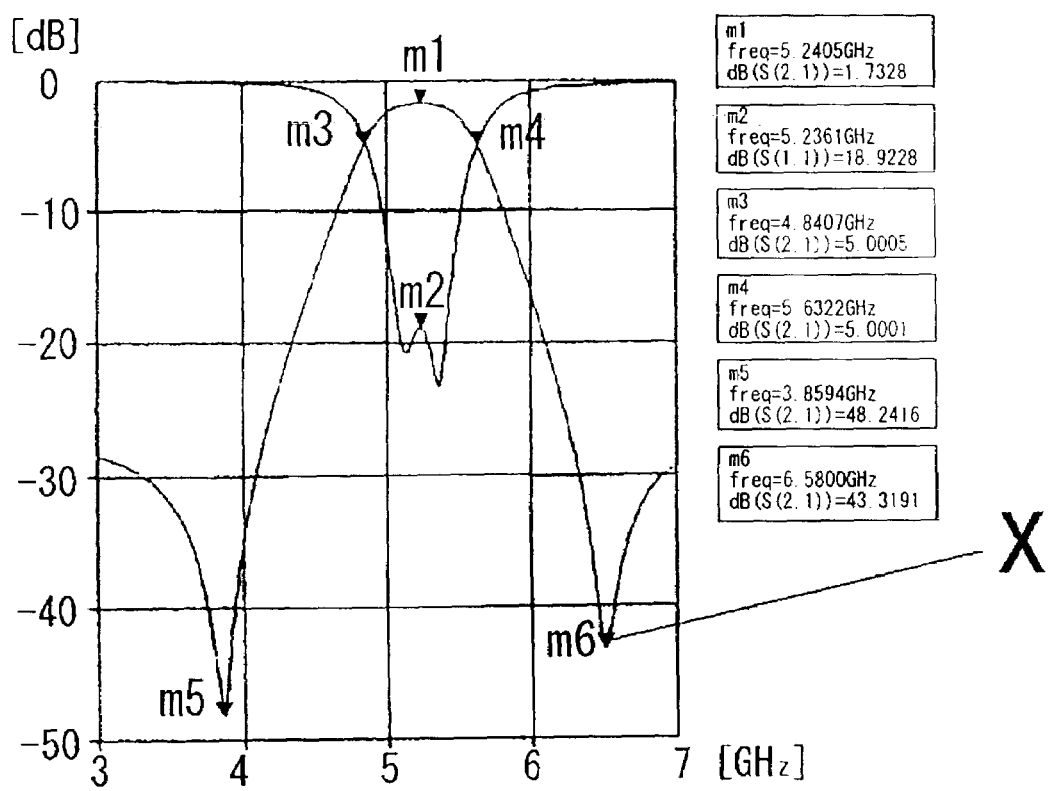
FIG. 4B is a graph showing frequency characteristics of a multilayer LC filter in which the distal ends of the stripe-shaped side-surface electrodes are formed so as to extend to the side surface of the first capacitor electrode layer.

FIG. 4B shows the frequency characteristics of the multilayer LC filter in which the stripe-shaped side-surface electrodes 10b are formed in such a manner that the distal ends of the side-surface electrodes 10b are located on the corresponding side surfaces of the first capacitor electrode layer 4, which generates the peak generation capacitor C13. In this case as well, as illustrated, an attenuation peak x appears on the higher-frequency side of the pass band.

As is apparent from FIGS. 4A and 4B, when the multilayer LC filter 1 has a configuration such that the distal ends of the stripe-shaped side-surface electrodes 10b are located on the corresponding side surfaces of the capacitor laminated section 11, the multilayer LC filter 1 produces an attenuation peak x that appears on the higher-frequency side of the pass band. It is noted that the length of the stripe-shaped side-surface electrodes 10b may be arbitrarily determined, i.e., may be a length chosen by the designer, so long as the distal ends of the stripe-shaped side-surface electrodes 10b are located on the corresponding side surfaces of the capacitor laminated section 11.

Figure 5B:
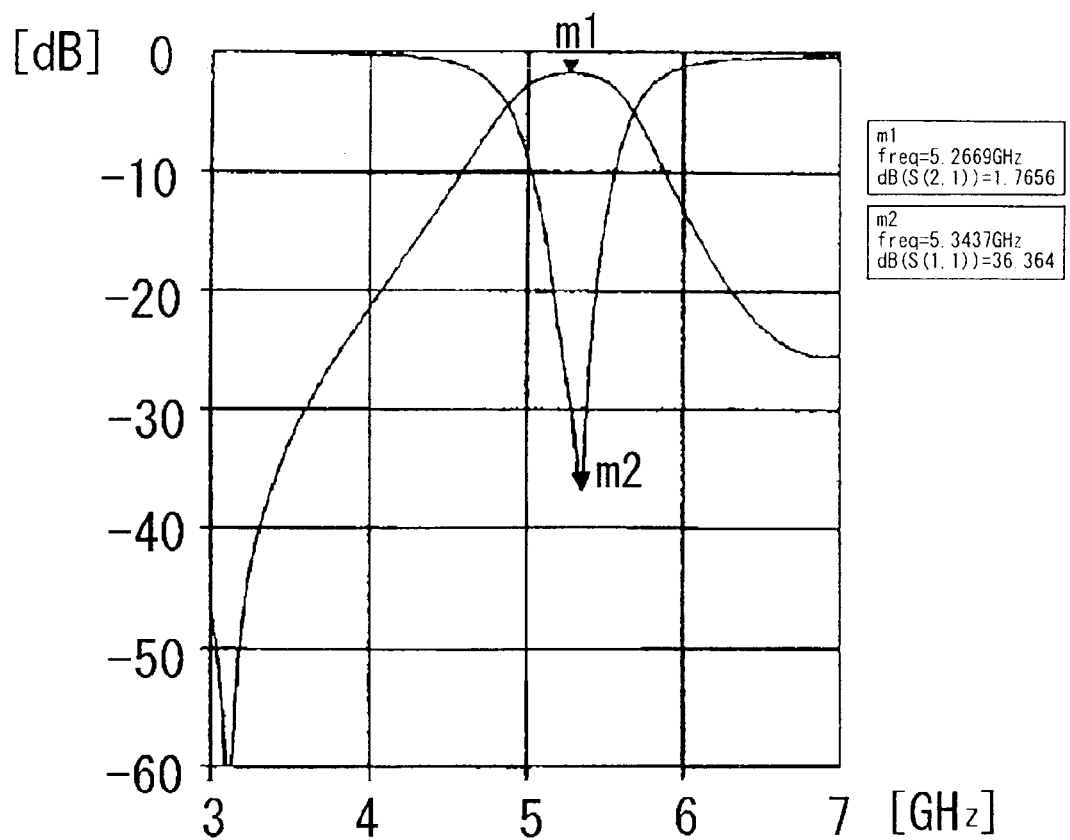
FIG. 5B is a graph showing frequency characteristics of a multilayer LC filter in which the distal ends of the stripe-shaped side-surface electrodes are formed so as to extend to the side surface of the inductor layer.

In contrast to FIGS. 4A and 4B, FIGS. 5A to 5C show the frequency characteristics of the multilayer LC filter 1 for the case where the distal ends of the stripe-shaped side-surface electrodes 10b are not located at, i.e., do not extend to, the corresponding side surfaces of the capacitor laminated section 11. FIG. 5A shows the frequency characteristics of the multilayer LC filter in which the stripe-shaped side-surface electrodes 10b are formed in such a manner that the distal ends of the side-surface electrodes 10b are located at the corresponding side surfaces of the first ground electrode layer 7. In this case, as illustrated, no attenuation peak appears on the higher-frequency side of the pass band.

Figure 5C:
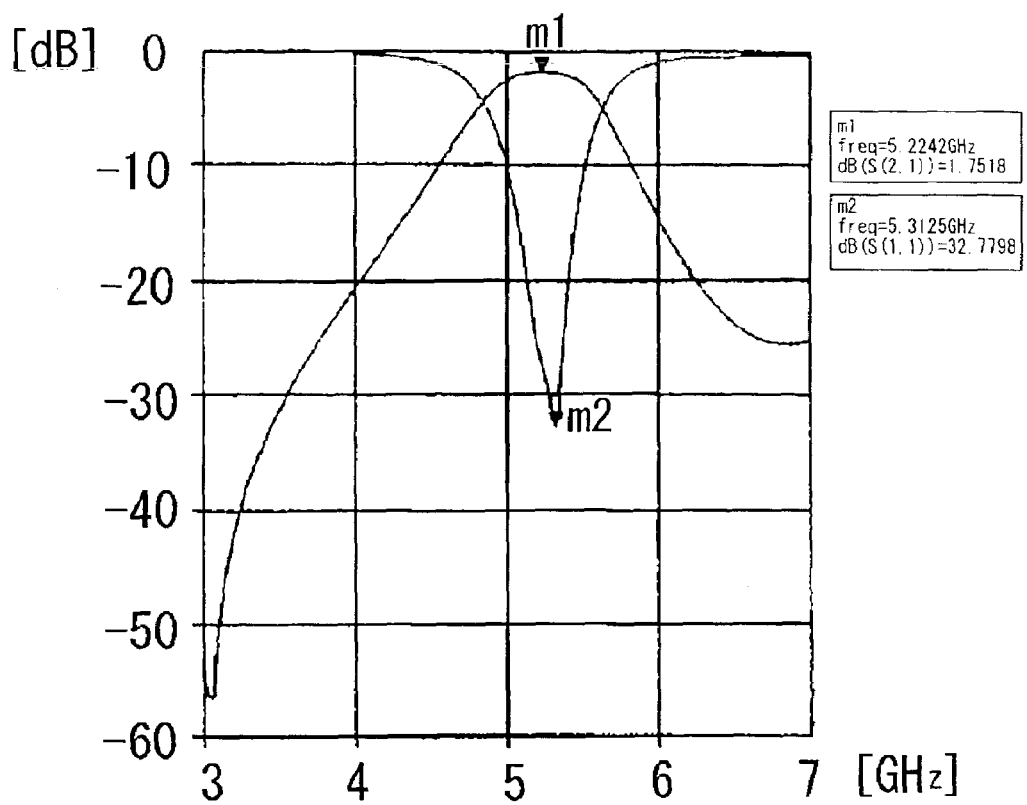
FIG. 5C is a graph showing frequency characteristics of a multilayer LC filter in which the distal ends of the stripe-shaped side-surface electrodes are formed so as to extend to the side surface of the second ground capacitor electrode layer.
Figure 6:
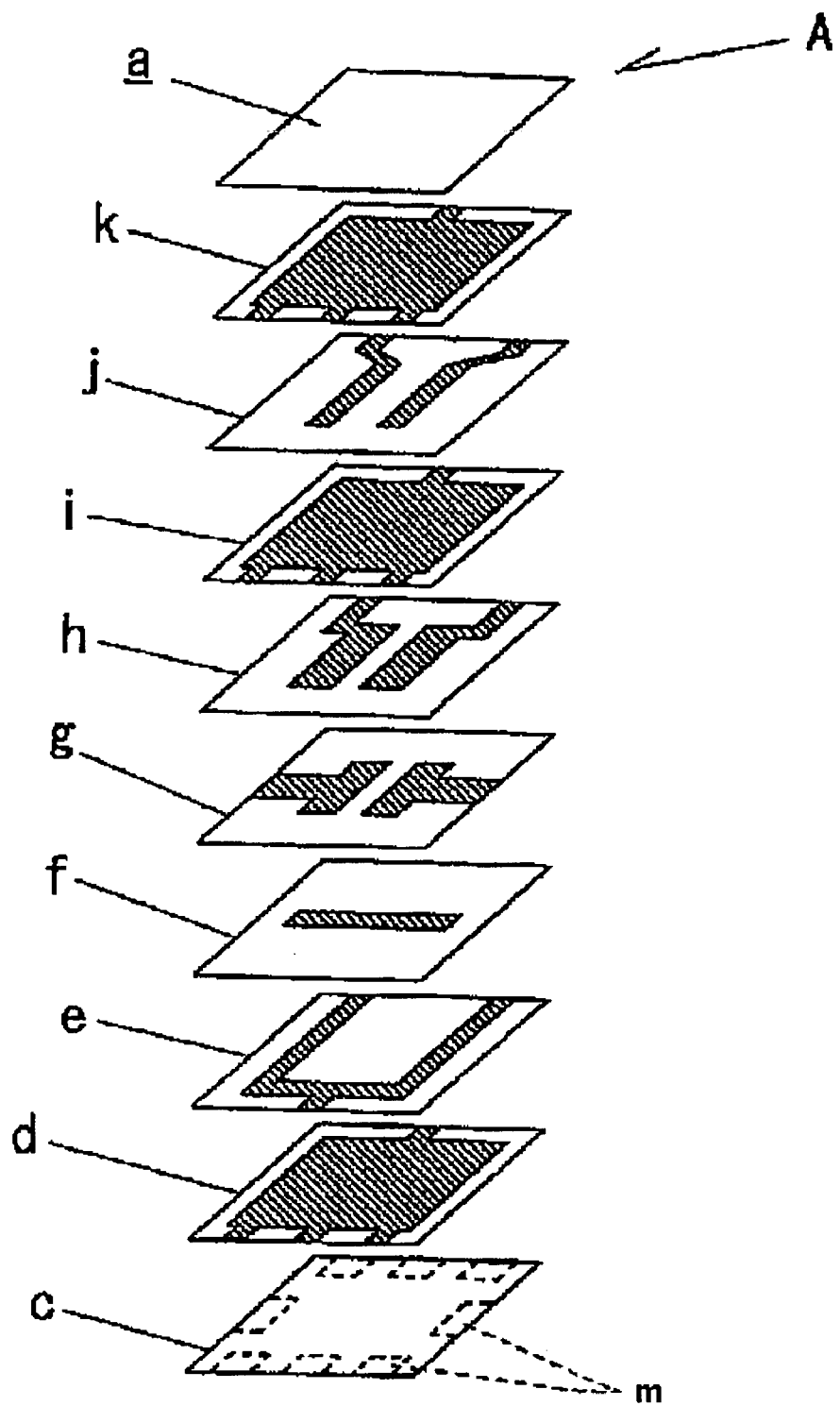
FIGS. 6 and 7, which were described above, are an exploded perspective view and an external perspective view, respectively, of a prior art multilayer LC filter.
Figure 7:
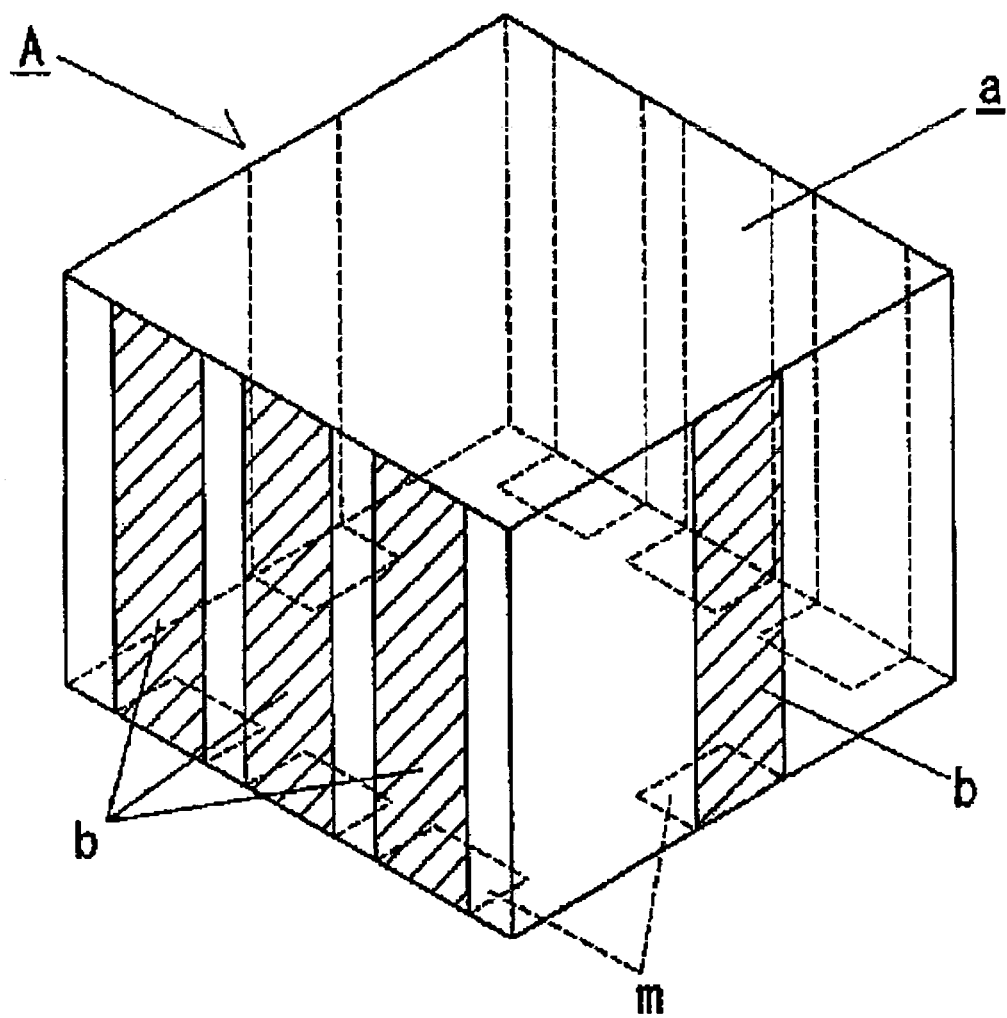

FIG. 5B shows the frequency characteristics of the multilayer LC filter in which the stripe-shaped side-surface electrodes 10b are formed in such a manner that the distal ends of the side-surface electrodes 10b are located at the corresponding side surfaces of the inductor layer (inductors) 8 while FIG. 5C shows the frequency characteristics of the multilayer LC filter in which the stripe-shaped side-surface electrodes 10b are formed in such a manner that the distal ends of the side-surface electrodes 10b are located at the corresponding side surfaces of the second ground electrode layer (second ground electrode) 9. In both of these cases as well, no attenuation peak appears on the higher-frequency side of the pass band.

As described above, when the multilayer LC filter 1 has a configuration such that the distal ends of the stripe-shaped side-surface electrodes 10b reach the corresponding side surfaces of the first ground electrode layer 7, the inductor layer 8, or the second ground electrode layer 9, i.e., layers which are located above the capacitor laminated section 11, no attenuation peak appears on the higher-frequency side of the pass band. In other words, when the stripe-shaped side-surface electrodes 10b cover the corresponding side surfaces of the first ground electrode layer, no attenuation peak appears on the higher-frequency side of the pass band.

Since the multilayer LC filter 1 has a configuration such that the distal ends of the stripe-shaped side-surface electrodes 10b connected to the input terminal 17 and the output terminal 18, respectively, cover only the corresponding side surfaces of the capacitor laminated section 11, a desired attenuation peak x is generated on the higher-frequency side of the pass band, whereby the filter characteristics of the multilayer LC filter 1 are improved.

It is noted that the number of the capacitor layers of the capacitor laminated section 11 can be freely changed. Further, the precise configuration of the multilayer LC filter 1 can be freely changed without departing from the scope of the present invention.

More generally, although the invention has been described above in relation to preferred embodiments thereof, it will be understood by those skilled in the art that other variations and modifications can be effected in these preferred embodiments without departing from the scope and spirit of the invention.

What is claimed is:

1. A multilayer LC filter comprising a laminated body including a plurality of laminated dielectric layers which define a direction of lamination, said multilayer filter including:

first and second resonator inductors formed on a common dielectric layer;
a first LC resonance circuit including said first resonator inductor; and
a second LC resonance circuit including said second resonator inductor, said multilayer LC filter further comprising:
input and output terminals formed on a surface of said laminated body;
a laminated capacitor section including a plurality of capacitor electrodes and a plurality of dielectric layers alternately laminated between said capacitor electrodes;
a first ground electrode formed between said laminated capacitor section and said inductors; and
first and second side-surface electrodes connected to said input terminal and said output terminal, respectively, said first and second side-surface electrodes each being formed on a side surface of said laminated body wherein said side-surface electrodes are not formed at locations which correspond to those of said first ground electrode and said inductors with respect to the direction of lamination of the dielectric layers.

2. A multilayer LC filter comprising a laminated body including a plurality of laminated dielectric layers which define a direction of lamination, said multilayer filter including:

a first LC resonance circuit containing a first resonator inductor; and
a second LC resonance circuit containing a second resonator inductor, said multilayer LC filter comprising:
input and output terminals formed on a surface of said laminated body;
a capacitor laminated section including a plurality of capacitor electrodes and a plurality of dielectric layers laminated alternately;
said first and second resonator inductors being formed on a common dielectric layer in spaced relation to said capacitor laminated section;
a first ground electrode formed between said capacitor laminated section and said first and second resonator inductors; and
first and second side-surface electrodes connected to said input terminal and said output terminal, respectively, said first and second side-surface electrodes each being formed on a side surface of said laminated body, wherein said side-surface electrodes do not extend to a location corresponding to that of said first ground electrode with respect to the direction of lamination of the dielectric layers.

3. A multilayer LC filter according to claim 2, wherein said first LC resonance circuit includes a first resonator capacitor, and said second LC resonance circuit includes a second resonator capacitor;
said first ground electrode is formed on a dielectric layer disposed below said first and second resonator inductors;
a second ground electrode is formed on a dielectric layer disposed above said first and second resonator inductors;
said laminated body carries said first resonator capacitor, said second resonator capacitor, and a frequency adjustment capacitor and said first resonator capacitor, said second resonator capacitor, and said frequency adjustment capacitor are constituted by the plurality of dielectric layers, the capacitor electrodes of said capacitor laminated section, and said first ground electrode.

4. A multilayer LC filter according to claim 3, wherein said capacitor laminated section includes first, second, and third capacitor electrode layers laminated in this sequence from the bottom, said first capacitor electrode layer including a center electrode formed on a dielectric layer, said second capacitor electrode layer including first and second input-output electrodes formed on a dielectric layer, said third capacitor electrode layer including first and second common electrodes formed on a dielectric layer, and wherein said multilayer LC filter further includes
  a peak generation capacitor constituted by said center electrode, said first input-output electrode, and said second input-output electrode;
  a first input-output coupling capacitor constituted by said first input-output electrode and said first common electrode;
  a second input-output coupling capacitor constituted by said second input-output electrode and said second common electrode;
  an inter-stage coupling capacitor constituted by said first and second common electrodes;
  a first resonator capacitor constituted by said first common electrode and said first ground electrode; and
  a second resonator capacitor constituted by said second common electrode and said first ground electrode, said peak generation capacitor, said first input-output coupling capacitor, said second input-output coupling capacitor, and said inter-stage coupling capacitor each serving as a frequency adjustment capacitor.

* * * * *